(12) United States Patent
Martin et al.

(10) Patent No.: US 7,521,363 B2
(45) Date of Patent: Apr. 21, 2009

(54) MEMS DEVICE WITH NON-STANDARD PROFILE

(75) Inventors: John R. Martin, Foxborough, MA (US); Lawrence E. Felton, Hopkinton, MA (US)

(73) Assignee: Analog Devices, Inc., Norwood, MA (US)

( * ) Notice: Subject to any disclaimer, the term of this patent is extended or adjusted under 35 U.S.C. 154(b) by 247 days.

(21) Appl. No.: 10/914,575

(22) Filed: Aug. 9, 2004

(65) Prior Publication Data

US 2006/0027885 A1    Feb. 9, 2006

(51) Int. Cl.
*H01L 29/84* (2006.01)

(52) U.S. Cl. .................. 438/691; 438/51; 438/113; 438/459; 438/703; 257/E21.499; 257/E31.117; 257/E31.127

(58) Field of Classification Search .......... 438/51, 438/421, 424, 459, 106, 113, 406, 691, 692, 438/702, 745; 257/414, 415, E21.499, E31.117, 257/E31.127
See application file for complete search history.

(56) References Cited

U.S. PATENT DOCUMENTS

| | | | |
|---|---|---|---|
| 5,362,681 A | 11/1994 | Roberts, Jr. | |
| 5,939,633 A | 8/1999 | Judy | |
| 6,433,401 B1 * | 8/2002 | Clark et al. | 257/524 |
| 6,505,511 B1 | 1/2003 | Geen et al. | |
| 6,900,072 B2 * | 5/2005 | Patel et al. | 438/106 |
| 2002/0096743 A1 | 7/2002 | Spooner | |
| 2002/0115234 A1 | 8/2002 | Siniaguine | 438/107 |
| 2003/0020062 A1 | 1/2003 | Faris | 257/40 |
| 2003/0075794 A1 | 4/2003 | Felton | |
| 2004/0002215 A1 | 1/2004 | Dewa | 438/689 |
| 2004/0035461 A1 | 2/2004 | Susko | 137/209 |
| 2005/0206483 A1 * | 9/2005 | Pashby et al. | 333/262 |

FOREIGN PATENT DOCUMENTS

| | | |
|---|---|---|
| EP | 0657759 | 12/2001 |
| WO | WO 98/19337 | 5/1998 |
| WO | WO 03/054927 | 7/2003 |
| WO | WO 2004/035461 | 4/2004 |

OTHER PUBLICATIONS

North American Silicon Wafer Committee, SEMI MI-0704, Specifications for Polished Monocrystalline Silicon Wafers, pp. 1-27 & Appendices, 1978, 2001, 2004.
Bharat Bhushan (Ed.), High Volume Manufacturing and Field Stability of MEMS Products, Spring Handbook, pp. 1087-1113, 2004.
Authorized Officer Klaus Meierewert, *The International Search Report and the Written Opinion of the International Searching Authority*, Sep. 14, 2005, 13 pages.

* cited by examiner

*Primary Examiner*—Sue A Purvis
*Assistant Examiner*—Fazli Erdem
(74) *Attorney, Agent, or Firm*—Bromberg & Sunstein LLP

(57) ABSTRACT

A method of producing a MEMS device forms structure on a non-standard device wafer. To that end, the method provides the noted non-standard device wafer, which has a wafer outer diameter and a non-standard thickness. As known by those in the art, a standard device wafer has a standard thickness when its outer diameter equals the wafer outer diameter. In illustrative embodiments, however, the non-standard thickness is smaller than the standard thickness. The method then forms structure on the non-standard device wafer.

20 Claims, 2 Drawing Sheets

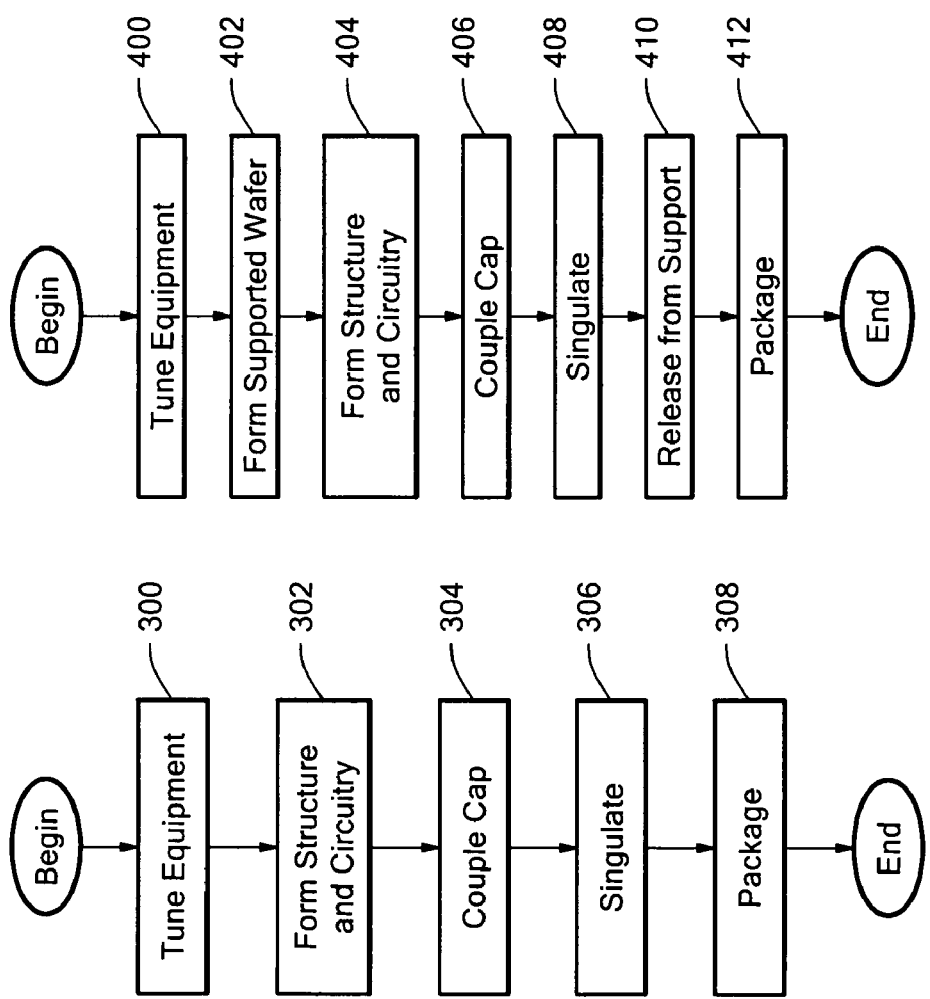

MEMS DEVICE WITH NON-STANDARD PROFILE

RELATED PATENT APPLICATIONS

This patent application is related to co-pending U.S. patent application Ser. No. 10/914,576, entitled, "METHOD OF PRODUCING A MEMS DEVICE," filed on even date herewith, and owned by Analog Devices, Inc., the disclosure of which is incorporated herein, in its entirety, by reference.

FIELD OF THE INVENTION

The invention generally relates to microelectromechanical systems (MEMS) and, more particularly, the invention relates to methods of producing MEMS devices.

BACKGROUND OF THE INVENTION

Microelectromechanical systems ("MEMS," also referred to as "MEMS devices") are a specific type of integrated circuit used in a growing number of applications. For example, MEMS currently are implemented as gyroscopes to detect pitch angles of airplanes, and as accelerometers to selectively deploy air bags in automobiles. In simplified terms, such MEMS devices typically have a very fragile movable structure suspended above a substrate, and associated circuitry (on chip or off chip) that both senses movement of the suspended structure and delivers the sensed movement data to one or more external devices (e.g., an external computer). The external device processes the sensed data to calculate the property being measured (e.g., pitch angle or acceleration).

Although they are relatively small, there still is a continuing need to reduce the size of MEMS devices and other types of integrated circuits. For example, in the cell phone industry, engineers often attempt to reduce the profile of internal application specific integrated circuits (ASICs) that have circuitry only. A reduction in the ASIC profile desirably can lead to a corresponding reduction in the overall size of the cell phone. To those ends, many in that field use conventional substrate thinning processes (e.g., backgrinding processes) to thin the substrates of many types of ASICs.

Undesirably, the prior art does not appear to have a similar solution for MEMS devices. Specifically, prior art substrate thinning techniques may damage the fragile MEMS movable structure. For example, prior art backgrinding processes (commonly used for integrated circuits without structure) require that the top side of the ASIC be secured to a supporting surface so that the bottom side may be exposed for backgrinding processes. The top side of a MEMS device, however, has the fragile MEMS structure. Accordingly, the MEMS structure would be crushed if backgrinding were used to thin the substrate of a MEMS device.

SUMMARY OF THE INVENTION

In accordance with one aspect of the invention, a method of producing a MEMS device forms structure on a non-standard device wafer. To that end, the method provides the noted non-standard device wafer, which has a wafer outer diameter and a non-standard thickness. As known by those in the art, a standard device wafer has a standard thickness when its outer diameter equals the wafer outer diameter. In illustrative embodiments, however, the non-standard thickness is smaller than the standard thickness. The method then forms structure on the non-standard device wafer.

When the standard thickness is expressed as being within a tolerance range, the non-standard thickness may be smaller than the standard thickness less about half the tolerance range. In some embodiments, the method couples the non-standard device wafer to a package.

The non-standard device wafer may be provided on a support structure. Among other things, the support structure may include at least an insulator or a wafer. After the structure is formed, the method may separate the non-standard device wafer from the support structure. Illustratively, when supported on the support structure, the non-standard thickness may be less than or equal to about 300 microns.

In some embodiments, the non-standard thickness is between about 50% to 80% of the standard thickness. Moreover, the method may form electronics on the non-standard device wafer. The electronics may cooperate with the structure. Although its thickness is non-standard, its outer diameter may be in standard sizes, such as approximately 2 inches, 3 inches, 100 millimeters, 125 millimeters, 150 millimeters, 200 millimeters or 300 millimeters.

In accordance with another aspect of the invention, a method of producing a MEMS device forms a non-standard device wafer having a wafer outer diameter and a non-standard thickness. As noted above, a standard device wafer has a standard thickness when its outer diameter equals the wafer outer diameter. The non-standard thickness thus is smaller than the standard thickness. The structure may be formed on the non-standard device wafer.

In accordance with another aspect of the invention, a method of producing a MEMS device provides a non-standard device wafer having a wafer outer diameter and a non-standard thickness. The non-standard thickness is smaller than the standard thickness. After securing it to a support structure, the method forms structure on the non-standard device wafer. The support structure then may be removed from the non-standard device wafer after the structure is formed.

In accordance with another aspect of the invention, a MEMS device has a non-standard device wafer having a wafer outer diameter and a non-standard thickness. A standard device wafer has a standard thickness when its outer diameter equals the wafer outer diameter. The non-standard thickness is smaller than the standard thickness. The MEMS device also includes structure formed on the non-standard device wafer.

BRIEF DESCRIPTION OF THE DRAWINGS

The foregoing and advantages of the invention will be appreciated more fully from the following further description thereof with reference to the accompanying drawings wherein:

FIG. 3 generally shows an exemplary process of forming a MEMS device using a non-standard wafer in accordance with illustrative embodiments of the invention.

FIG. 4 generally shows an exemplary process of forming a MEMS device using a non-standard wafer on a support structure in accordance with illustrative embodiments of the invention.

FIG. 5 schematically shows a cross-sectional view of a MEMS wafer on a support structure prior to processing.

DESCRIPTION OF ILLUSTRATIVE EMBODIMENTS

In illustrative embodiments, a MEMS device is formed from non-standard MEMS wafers. Such MEMS wafers illustratively have a thickness that is less than that of standard MEMS wafers. Details of illustrative embodiments are discussed below.

Figure 1:
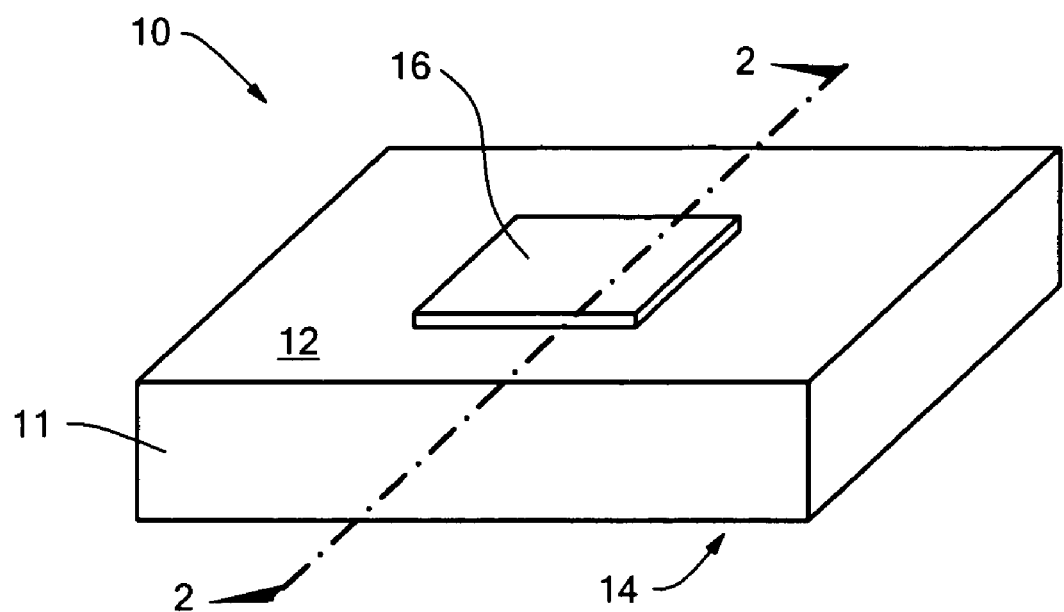
FIG. 1 schematically shows an exemplary MEMS device that may be produced in accordance with illustrative embodiments of the invention.

FIG. 1 schematically shows a generic MEMS device 10 that may be produced in accordance with illustrative embodiments of the invention. Specifically, the MEMS device 10 shown includes a device wafer 11 (also referred to as the MEMS wafer 11) having movable structure 13 (FIG. 2, discussed below and often referred to in the art as "microstructure") suspended over a substrate 14. Conventional processes may be employed to form the movable structure 13. For example, the structure 13 may be formed by conventional surface micromachining ("SMM") techniques. As known by those skilled in the art, surface micromachining techniques build material layers on top of a substrate using additive and subtractive processes. In such cases, the MEMS structure 13 may be considered to be formed slightly above or on the top surface 12 of a silicon wafer.

As a further example, the structure 13 may be formed by etching material from the top wafer of a silicon-on-insulator wafer ("SOI wafer"). In such case, the MEMS structure 13 may be considered to be formed substantially flush with or below the top surface 12 of a silicon wafer. Moreover, the overall thickness of the SOI wafer illustratively is thinner than standard SOI wafers. Of course, other types of processes may be employed to form the MEMS structure 13.

To protect the fragile MEMS structure 13, the MEMS device 10 also has a cap 16 secured to the device wafer 11 via a glass bonding layer. In illustrative embodiments, the cap 16 hermetically seals the structure 13 (i.e., the cap 16 encapsulates the structure 13) from the environment. As further environmental protection, conventional processes also may mount the entire MEMS device 10 within a package. As noted above, however, the MEMS device 10 may omit the cap 16. In that case, the MEMS device 10 preferably is within a package that can sufficiently protect the MEMS structure 13 from environmental contaminants, such as dust and moisture. Accordingly, discussion of a MEMS device 10 with a cap 16 is illustrative for some embodiments only.

The MEMS device 10 may include on-chip circuitry 18 to control and/or monitor the structure 13. The circuitry 18 has interconnects (not shown) to electrically communicate with an external device, such as a computer. Alternatively, the MEMS device 10 may have structure 13 only. In such case, the structure 13 may communicate with off-chip circuitry 18 for the noted purposes.

Figure 2:
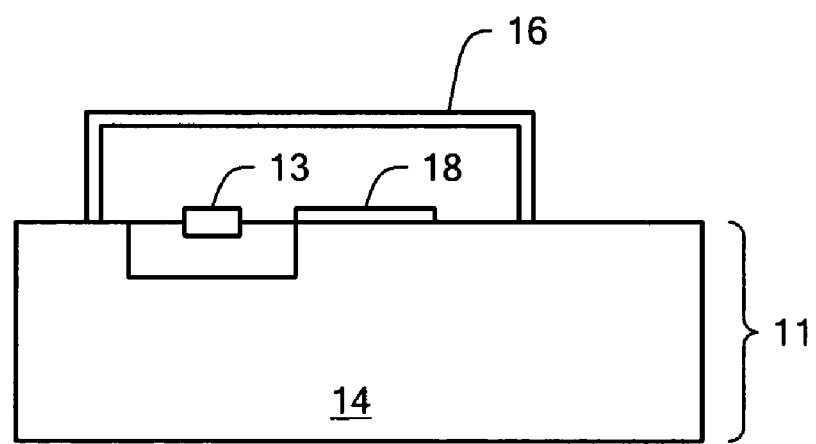
FIG. 2 schematically shows a cross-sectional view of the MEMS device shown in FIG. 1 along line 2-2.

FIG. 2 schematically shows a cross-sectional view of the MEMS device 10 shown in FIG. 1 along line 2-2. In the example shown, the MEMS device 10 includes the noted movable structure 13 suspended above a substrate 14 formed by the MEMS wafer 11. In addition, the MEMS device 10 also has the above noted on-chip circuitry 18 to monitor and/or control the movable structure 13. As discussed in greater detail herein, the MEMS wafer 11 has a smaller profile than standard MEMS wafers. Additional details are discussed below.

Illustrative embodiments implement the MEMS device 10 as an inertial sensor, such as an accelerometer or a gyroscope. When implemented as an accelerometer, the structure 13 includes a normally stable (movable) mass suspended above the substrate 14, and circuitry 18 (not shown but noted above) for detecting mass movement. Exemplary MEMS accelerometers include those distributed and patented by Analog Devices, Inc. of Norwood, Mass. Among others, see U.S. Pat. No. 5,939,633, the disclosure of which is incorporated herein, in its entirety, by reference.

When implemented as a gyroscope, the MEMS device 10 has an oscillating mass suspended above the substrate 14, and circuitry 18 (not shown but noted above) for actuating and detecting mass movement. Exemplary MEMS gyroscopes include those distributed and patented by Analog Devices, Inc. of Norwood, Mass. Among others, see U.S. Pat. No. 6,505,511, the disclosure of which is incorporated herein, in its entirety, by reference.

Discussion of an inertial sensor, however, is exemplary and thus, not intended to limit various embodiments of the invention. Accordingly, principles of various embodiments may apply to methods of producing other types of MEMS devices, such as piezoelectric devices.

As known by those skilled in the art, the semiconductor industry has invested heavily in robust equipment, materials, processes, factory automation, and software. Standardization efforts by organizations such as SEMI (Semiconductor Equipment and Materials International) have been important in the drive to lower semiconductor manufacturing costs. One example of standardization is wafer thickness. Silicon, for example, is relatively brittle and thus, can easily break when handled. Standard wafer thicknesses thus have been developed to minimize such undesirable results.

As a result of standardization, semiconductor manufacturers typically tune their semiconductor production processes and equipment to optimally operate with standard wafer thicknesses. Table 1 below lists some representative standard thicknesses of single crystal, single sided polished silicon wafers as well known in the art. The information in Table 1 is taken from the SEMI M1-0704 SPECIFICATIONS FOR POLISHED MONOCRYSTALLINE SILICON WAFERS, copyright 1978, 2004 by SEMI, the disclosure of which is incorporated herein, in its entirety, by reference.

It should be noted that although the discussed thicknesses are for single crystal, single sided polished silicon, various embodiments apply to other types of wafers, such as double sided polished wafers and epi wafers. Accordingly, discussion of the values in Table 1 are illustrative and not representative of all embodiments.

As noted, the thicknesses of the wafers in Table 1 vary as a function of the diameter of the wafer. Moreover, there are tolerances that permit some variance in wafer thickness. Both the thicknesses and tolerances in Table 1 are given at the center of the wafer. In illustrative embodiments, the MEMS device 10 is formed from a silicon wafer (i.e., a MEMS wafer 11) that is thinner than the standard thickness, less its tolerance. For example, the MEMS device 10 may be formed from a 125 millimeter single crystal, single side polished prime silicon wafer having a thickness that is less than about 605 microns. It is anticipated that MEMS wafers 11 having a thickness of between about fifty and eighty percent of standard thicknesses, less their tolerances, should produce satisfactory results.

TABLE 1

Thickness for Silicon Semiconductor Wafers

| Wafer Diameter (mm) | Wafer Diameter (in) | Thickness (microns) | Typical Tolerance (+/− microns) |
|---|---|---|---|
| 50 | 2 | 279 | 25 |
| 75 | 3 | 381 | 25 |
| 100 | N/A | 525 or 625 | 20 |

TABLE 1-continued

Thickness for Silicon Semiconductor Wafers

| Wafer Diameter (mm) | Wafer Diameter (in) | Thickness (microns) | Typical Tolerance (+/− microns) |
|---|---|---|---|
| 125 | N/A | 625 | 20 |
| 150 | N/A | 675 | 20 |
| 200 | N/A | 725 | 20 |
| 300 | N/A | 775 | 20 |

As noted above, illustrative embodiments produce MEMS devices 10 from non-standard MEMS wafers 11. Such wafers typically are produced from silicon. Illustrative embodiments nevertheless also are applicable to other MEMS technologies that do not use silicon wafers. For example, illustrative embodiments also are applicable to MEMS products that currently use standard thickness wafers of such as glass, germanium, germanium-on-insulator, silicon-germanium, and compound semiconductors (among others). Accordingly, discussion of silicon is exemplary of some embodiments of the invention, but not intended to limit all standardized materials.

Those in the MEMS art understand the difficulty in producing MEMS devices. Specifically, due to the fragility of the structure 13 in MEMS devices, conventional production processes often damage many of the resulting MEMS devices formed on a single wafer. Among others things, debris from micromachining, process fluids, bow caused by deposition of materials (e.g., metalized layers), and unintended electronic charge differentials between surfaces contribute to these difficulties. Such damage commonly renders many of the noted MEMS devices unusable. There is a disincentive to use thinner, non-standard MEMS wafers in the art because such MEMS wafers are believed to add to the noted fabrication difficulties. For example, thinner wafers are more likely to bow or crack. In particular, bow is a function of thickness raised to the third power. Processing therefore becomes non-linearly more difficult when the MEMS wafer 11 is thinner.

Moreover, those in the art could use smaller diameter standard wafers and thus, achieve a desired thinness. For example, rather than use a standard 150 millimeter wafer (i.e., having a thickness of about 675 microns), a fabrication process may use a standard two inch wafer (i.e., having a thickness of about 279 microns). A smaller wafer, however, has a much lower yield because it cannot produce as many MEMS devices. Accordingly, by way of example, illustrative embodiments may use a 150 millimeter wafer having the thickness of a two inch wafer. In so doing, manufacturing yield is maintained while producing a thinner MEMS device 10. As noted above, the thinner device is highly desirable and enables more uses of the MEMS device 10.

The problems associated with thinner wafers can be minimized by improving wafer handling processes during fabrication. One wafer handling method may be used with MEMS wafers 11 on the thicker side (e.g., wafers thicker than about 300 microns), while another may be used with wafers on the thinner side (e.g., wafers equal to or thinner than about 300 microns). FIG. 3 addresses handling thicker MEMS wafers 11, while FIG. 4 addresses handling thinner MEMS wafers 11.

Specifically, FIG. 3 generally shows an exemplary process of forming a MEMS device 10 using a non-standard wafer on the thicker side. The process begins at step 300, in which the equipment/fixtures and sub-processes used in the fabrication process are calibrated and/or tuned to the specific thickness of the non-standard wafers. Many may be tuned much in the same manner as they are tuned for use with standard MEMS wafers. After they are tuned, they may be set to enable continuous or subsequent processing of non-standard wafers having the "tuned" thicknesses. The tuning may vary depending upon the type of MEMS device and requirements of the MEMS device being produced. Exemplary tuning processes, such as wafer load and unload, fixturing for deposition, and heating/cooling are discussed below for production of an inertial MEMS device.

The process continues to step 302, in which structure 13 and circuitry 18 are formed on the die in accordance with conventional processes (i.e., within the constraints of the tuning process). See various of the incorporated patents (among other things) for some details of the structure 13 and circuitry 18 and their formation. In alternative embodiments, no circuitry 18 is formed. In such case, the MEMS device 10 has structure 13 only.

After the structure 13 and circuitry 18 are formed, the cap wafer may be coupled to the MEMS wafer 11 (step 304), such as by means of a glass frit layer. For more information relating to capping, see U.S. patent publication No. 2003/0075794A1, the disclosure of which is incorporated herein, in its entirety, by reference. In an exemplary embodiment of the present invention, the cap wafer is bonded to the MEMS wafer with a borosilicate glass bonding material. The glass is typically one that is commonly known as Ferro 11-036. The glass is typically purchased as a paste, which is screen-printed onto the bottom of the cap walls of the cap wafer. The width of the screen-printed glass is typically 25 microns less than the width of the cap walls. The thickness of the glass paste after screen-printing is approximately 20-30 um. The glass paste is subjected to a glazing process to burn off the organic binder materials and consolidate the glass by melting it. The glaze process consists of approximately 10 minutes at 420 C in clean dry air. After glazing, the thickness of the glass is approximately 12 um.

The process then continues to step 306, in which the cap 16 and/or MEMS wafer 11 may be singulated to produce a plurality of individual MEMS devices 10. After some post-processing steps (e.g., probe and test), the MEMS devices 10 may be secured within a conventional package (step 308).

As noted above with reference to step 300, the fabrication equipment and processes must be tuned to handle non-standard MEMS wafers 11. Below is a discussion of some issues with metal deposition and exemplary approaches for tuning the process. Many of these problems and approaches can be generalized to apply to other MEMS wafer 11 processing steps.

Handling for load and unload: Cassette to cassette processing tools may have robotic handlers for loading and unloading wafers from the deposition tool. With a non-standard MEMS wafer 11, the handler-wafer interface can be more problematic. To minimize these problems, the following may be implemented:

1. Align the pick-up arm to the cassette slot to prevent edge chipping and wafer breakage.
2. Select the handler to provide maximum latitude for wafer bow.
3. If the load arm utilizes backside vacuum during handling, it should be carefully adjusted to not break the MEMS wafer 11. To that end, the process may use a load arm with a larger surface area of backside wafer contact with low vacuum across a broader area to prevent point stress.

4. A load arm design without vacuum may be required for the MEMS wafers 11. A load fixture with recessed mechanical guides or mechanical stops thus may be used.
5. In some cases, it may be more feasible to use batch processing with manual load and unload to avoid robotic handling altogether.

Fixturing for deposition: Holding non-standard MEMS wafers 11 in place during the actual processing steps also is important. Many deposition tools, for example, rely on a clamp ring or clips to hold the wafer during deposition. Accordingly, the following tuning processes may be employed:
1. Rather than use a clip, which can chip or break the non-standard MEMS wafers 11, a clamp ring may be used. Specifically, a clamp ring should provide better results than clips by distributing the stress around the full wafer edge. The clamp should be completely free of burrs or particles, however, and clamp pressure should be relatively gentle and well controlled.
2. To minimize breakage, fixturing should permit thermal expansion and contraction of the MEMS wafer 11 without unduly constraining it. For example, seating a wafer by gravity in a slightly oversized recess may be preferable to constraining it on the backside with vacuum, or on the edges with mechanical clamping or pins.

Substrate Distortion or Breakage—thermal, stress, mechanical: Assuming success is achieved in loading and holding the MEMS wafer(s) 11, the process must now be completed without distorting or breaking the wafer.
1. If the processing step involves wafer heating and/or cooling, a non-standard MEMS wafer 11 may be more likely to break. For example, plasma processing typically results in wafer heating. In deposition, if the deposited materials and substrate 14 have mismatched CTE (coefficient of thermal expansion), wafer breakage or distortion may occur. Careful selection of materials and process optimization thus is warranted.
2. Minimize deposited film stress to reduce wafer distortion and breakage.
3. Orientation of the wafer in relation to gas flow and the conductance path of the vacuum system are important when the substrate 14s are thinner than standard sizes. Accordingly, in chamber design and orientation, efforts should be made to minimize differential pressures on the substrate 14.
4. Mechanical transfer of the wafer from station to station within a processing tool could be problematic. Some examples of this are transfer from a sputter etch chamber to a metal deposition chamber within a deposition tool, movement between showerhead positions in a CVD tool, and spinning and transfer from photoresist coat to the bake module in a coat track. Because thin wafers may be more likely to slide out of position or to break, some mechanical means for securing them in place should be used.

FIG. 4 generally shows an exemplary process of forming a MEMS device 10 using a non-standard wafer on the thinner side. It should be noted, however, that this process also may be used with non-standard MEMS wafers 11 on the thicker side. The process begins at step 400, in which the equipment is tuned. For more details, see the above discussion regarding equipment tuning.

The process then continues to step 402, in which a supported wafer is formed. More specifically, the MEMS wafer 11 is supported by a support structure 13 that ultimately will be removed. FIG. 5 shows one exemplary supported wafer 20, which is a silicon-on-insulator (SOI) wafer. Specifically, the supported wafer includes the non-standard MEMS wafer 11, a much thicker handle wafer 22, and an insulator 24 between the two wafers 11 and 22.

It should be noted that the SOI wafer is exemplary, however, and not intended to limit the scope of all embodiments of the support structure. Other support structures may be used. For example, the non-standard MEMS wafer 11 may be supported by the oxide only, or a silicon germanium wafer. Other examples include epi wafers and wafers treated in a manner that promotes subsequent cleavage.

The next three steps are substantially similar to their corresponding steps shown in FIG. 3. Specifically, structure 13 and circuitry 18 may be formed on the non-standard MEMS wafer 11 (step 404), followed by cap wafer coupling (step 406) and a singulate step (step 408). Of course, as noted above, the MEMS device 10 may be formed without the circuitry 18. Moreover, only the cap wafer may be singulated. In some embodiments, however, the cap wafer, MEMS wafer 11, and the handle wafer 22 also are singulated. In other embodiments, only the cap wafer and MEMS wafer 11 are singulated.

After singulation, the MEMS wafer 11 may be released from the support wafer (step 410). If the SOI wafer of FIG. 5 is used, for example, then acid may be applied to the insulator layer to effectively remove the MEMS wafer 11. The structure 13 on the MEMS wafer 11 also may be released by this step. Accordingly, if the MEMS wafer 11 is singulated, this step produces a plurality of individual MEMS devices 10. After some post-processing steps, the MEMS devices 10 then may be coupled within a conventional package.

By using the noted guidelines, illustrative embodiments can produce thin MEMS devices 10 from non-standard wafers having lower profiles. Such non-standard wafers may be pre-formed to have non-standard sizes during conventional wafer fabrication processes, or be ground to non-standard sizes by conventional thinning processes. Among other things, such thinning processes may include backgrinding processes or chemical etches.

As noted above, using thin MEMS wafers 11 to produce thin MEMS devices 10 produces a number of beneficial results. Among others, it can reduce dimensional tolerances in various manufacturing processes, such as those required to produce MEMS devices 10 with through-holes or backside cavities. In fact, in some through hole applications, thinner MEMS wafers 11 can improve yield due to the fact that the backside hole size increases as wafer thickness increases (e.g., during an anisotropic etch process). In addition, thin wafers reduce etch time, such as during a dry etch process. As a result, production costs can be significantly reduced. Of course, thinner MEMS devices 10 have a variety of additional uses, such as uses in locations that could not accommodate prior art MEMS devices.

Although the above discussion discloses various exemplary embodiments of the invention, it should be apparent that those skilled in the art can make various modifications that will achieve some of the advantages of the invention without departing from the true scope of the invention.

What is claimed is:
1. A method of producing a wafer of capped MEMS devices, the method comprising:
    providing a non-standard device wafer having a wafer outer diameter and a non-standard thickness, a standard device wafer having a standard thickness when its outer diameter equals the wafer outer diameter, the non-standard thickness being smaller than the standard thickness; and forming structure for an inertial sensor on the non-standard device wafer, aligning a cap wafer to the non-standard device wafer;

clamping the cap wafer and the non-standard wafer; and bonding the cap wafer to the non-standard wafer to form the wafer of capped MEMS devices.

2. The method as defined by claim 1 wherein the standard thickness is within a tolerance range, the non-standard thickness being smaller than the standard thickness less about half the tolerance range.

3. The method as defined by claim 1 further including coupling the non-standard device wafer to a package.

4. The method as defined by claim 1 wherein providing includes providing the non-standard device wafer on a support structure.

5. The method as defined by claim 4 wherein the support structure includes at least one of an insulator and a wafer.

6. The method as defined by claim 4 further including separating the non-standard device wafer from the support structure.

7. The method as defined by claim 4 wherein the non-standard thickness is less than or equal to about 300 microns.

8. The method as defined by claim 1 wherein the non-standard thickness is between about 50% to 80% of the standard thickness.

9. The method as defined by claim 1 further including forming electronics on the non-standard device wafer, the electronics cooperating with the structure.

10. The method as defined by claim 1 wherein the wafer outer diameter has an approximate size of 2 inches, 3 inches, 100 millimeters, 125 millimeters, 150 millimeters, 200 millimeters or 300 millimeters.

11. A method of producing a wafer of capped MEMS devices, the method comprising:

forming a non-standard device wafer having a wafer outer diameter and a non-standard thickness, a standard device wafer having a standard thickness when its outer diameter equals the wafer outer diameter, the non-standard thickness being smaller than the standard thickness;

forming structure for an inertial sensor on the non-standard device wafer;

aligning a cap wafer to the non-standard device wafer;

clamping the cap wafer and the non-standard wafer; and bonding the cap wafer to the non-standard wafer to form the wafer of capped MEMS device.

12. The method as defined by claim 11 wherein the standard thickness is within a tolerance range, the non-standard thickness being smaller than the standard thickness less about half the tolerance range.

13. The method as defined by claim 11 wherein forming includes backgrinding the non-standard device wafer.

14. The method as defined by claim 11 wherein forming includes applying a chemical etch to the non-standard device wafer.

15. The method as defined by claim 11 wherein forming includes providing the non-standard device wafer on a support structure.

16. The method as defined by claim 15 wherein the non-standard thickness is less than or equal to about 300 microns.

17. A method of producing a wafer of capped MEMS devices, the method comprising:

providing a non-standard device wafer having a wafer outer diameter and a non-standard thickness, a standard device wafer having a standard thickness when its outer diameter equals the wafer outer diameter, the non-standard thickness being smaller than the standard thickness;

securing the non-standard device wafer to a support structure;

forming structure for an inertial sensor on the non-standard device wafer;

aligning a cap wafer to the non-standard device wafer;

clamping the cap wafer and the non-standard wafer;

bonding the cap wafer to the non-standard wafer; and removing the support structure from the non-standard device wafer to form the wafer of capped MEMS devices.

18. The method as defined by claim 17 wherein the non-standard thickness is less than or equal to about 300 microns.

19. The method as defined by claim 17 wherein the standard thickness is within a tolerance range, the non-standard thickness being smaller than the standard thickness less about half the tolerance range.

20. The method as defined by claim 17 wherein the wafer outer diameter has an approximate size of 2 inches, 3 inches, 100 millimeters, 125 millimeters, 150 millimeters, 200 millimeters or 300 millimeters.

* * * * *